(12) United States Patent
Bangsaruntip et al.

(10) Patent No.: US 8,384,065 B2
(45) Date of Patent: *Feb. 26, 2013

(54) GATE-ALL-AROUND NANOWIRE FIELD EFFECT TRANSISTORS

(75) Inventors: Sarunya Bangsaruntip, Yorktown Heights, NY (US); Josephine B. Chang, Yorktown Heights, NY (US); Guy M. Cohen, Yorktown Heights, NY (US); Jeffrey W. Sleight, Yorktown Heights, NY (US)

(73) Assignee: International Business Machines Corporation, Armonk, NY (US)

(*) Notice: Subject to any disclaimer, the term of this patent is extended or adjusted under 35 U.S.C. 154(b) by 558 days.

This patent is subject to a terminal disclaimer.

(21) Appl. No.: 12/631,199

(22) Filed: Dec. 4, 2009

(65) Prior Publication Data

US 2011/0133162 A1 Jun. 9, 2011

(51) Int. Cl.
*H01L 29/66* (2006.01)

(52) U.S. Cl. .... 257/24; 438/154; 977/938; 257/E21.411

(58) Field of Classification Search .................... 257/24, 257/E21.411, E21.632, E29.168; 438/151, 438/154; 977/938
See application file for complete search history.

(56) References Cited

U.S. PATENT DOCUMENTS

| | | |
|---|---|---|
| 4,995,001 A | 2/1991 | Dawson et al. |
| 5,308,445 A | 5/1994 | Takasu |
| 5,438,018 A | 8/1995 | Mori et al. |
| 5,552,622 A | 9/1996 | Kimura |
| 5,574,308 A | 11/1996 | Mori et al. |
| 5,668,046 A | 9/1997 | Koh et al. |
| 6,365,465 B1 | 4/2002 | Chan et al. |
| 6,642,115 B1 | 11/2003 | Cohen et al. |
| 6,653,209 B1 | 11/2003 | Yamagata |
| 6,806,141 B2 | 10/2004 | Kamins |
| 6,835,618 B1 | 12/2004 | Dakshina-Murthy et al. |
| 6,855,606 B2 | 2/2005 | Chen et al. |
| 6,882,051 B2 | 4/2005 | Majumdar et al. |
| 6,891,227 B2 | 5/2005 | Appenzeller et al. |

(Continued)

FOREIGN PATENT DOCUMENTS

| | | |
|---|---|---|
| EP | 217811 A1 | 4/2010 |
| KR | 20090044799 A | 5/2009 |

(Continued)

OTHER PUBLICATIONS

International Search Report; International Application No. PCT/US2011/029304; International Filing Date: Mar. 22, 2011; Date of Mailing: May 20, 2011.

(Continued)

*Primary Examiner* — Roy Potter
(74) *Attorney, Agent, or Firm* — Cantor Colburn LLP; Vazken Alexanian

(57) ABSTRACT

A method for forming a nanowire field effect transistor (FET) device, the method includes forming a suspended nanowire over a semiconductor substrate, forming a gate structure around a portion of the nanowire, forming a protective spacer adjacent to sidewalls of the gate and around portions of nanowire extending from the gate, removing exposed portions of the nanowire left unprotected by the spacer structure, and epitaxially growing a doped semiconductor material on exposed cross sections of the nanowire to form a source region and a drain region.

35 Claims, 14 Drawing Sheets

U.S. PATENT DOCUMENTS

| | | | |
|---|---|---|---|
| 6,903,013 | B2 | 6/2005 | Chan et al. |
| 6,996,147 | B2 | 2/2006 | Majumdar et al. |
| 7,101,762 | B2 | 9/2006 | Cohen et al. |
| 7,151,209 | B2 | 12/2006 | Empedocles et al. |
| 7,180,107 | B2 | 2/2007 | Appenzeller et al. |
| 7,211,853 | B2 | 5/2007 | Bachtold et al. |
| 7,253,060 | B2 | 8/2007 | Yun et al. |
| 7,297,615 | B2 | 11/2007 | Cho et al. |
| 7,311,776 | B2 | 12/2007 | Lin et al. |
| 7,443,025 | B2 | 10/2008 | Verbist |
| 7,446,025 | B2 | 11/2008 | Cohen et al. |
| 7,449,373 | B2 | 11/2008 | Doyle et al. |
| 7,452,759 | B2 | 11/2008 | Sandhu |
| 7,452,778 | B2 | 11/2008 | Chen et al. |
| 7,456,068 | B2 | 11/2008 | Kavalieros et al. |
| 7,456,476 | B2 | 11/2008 | Hareland et al. |
| 7,473,943 | B2 | 1/2009 | Mostarshed et al. |
| 7,498,211 | B2 | 3/2009 | Ban et al. |
| 7,534,675 | B2 * | 5/2009 | Bangsaruntip et al. ....... 438/197 |
| 7,550,333 | B2 | 6/2009 | Shah et al. |
| 7,569,941 | B2 | 8/2009 | Majumdar et al. |
| 7,642,578 | B2 | 1/2010 | Lee et al. |
| 7,791,144 | B2 | 9/2010 | Chidambarrao et al. |
| 7,795,677 | B2 * | 9/2010 | Bangsaruntip et al. ....... 257/347 |
| 7,799,657 | B2 | 9/2010 | Dao |
| 7,803,675 | B2 | 9/2010 | Suk et al. |
| 7,834,345 | B2 | 11/2010 | Bhuwalka et al. |
| 7,871,870 | B2 | 1/2011 | Mostarshed et al. |
| 7,893,506 | B2 | 2/2011 | Chau et al. |
| 8,097,515 | B2 * | 1/2012 | Bangsaruntip et al. ....... 438/282 |
| 2004/0149978 | A1 | 8/2004 | Snider |
| 2004/0166642 | A1 | 8/2004 | Chen et al. |
| 2005/0121706 | A1 | 6/2005 | Chen et al. |
| 2005/0266645 | A1 | 12/2005 | Park |
| 2005/0275010 | A1 | 12/2005 | Chen et al. |
| 2006/0033145 | A1 | 2/2006 | Kakoschke et al. |
| 2006/0138552 | A1 | 6/2006 | Brask et al. |
| 2007/0001219 | A1 | 1/2007 | Radosavljevic et al. |
| 2007/0267619 | A1 | 11/2007 | Nirschl |
| 2007/0267703 | A1 | 11/2007 | Chong et al. |
| 2007/0284613 | A1 | 12/2007 | Chui et al. |
| 2008/0014689 | A1 | 1/2008 | Cleavelin et al. |
| 2008/0061284 | A1 | 3/2008 | Chu et al. |
| 2008/0067495 | A1 | 3/2008 | Verhulst |
| 2008/0067607 | A1 | 3/2008 | Verhulst et al. |
| 2008/0079041 | A1 | 4/2008 | Suk et al. |
| 2008/0085587 | A1 | 4/2008 | Wells et al. |
| 2008/0121932 | A1 | 5/2008 | Ranade |
| 2008/0135949 | A1 | 6/2008 | Lo et al. |
| 2008/0142853 | A1 | 6/2008 | Orlowski |
| 2008/0149914 | A1 | 6/2008 | Samuelson et al. |
| 2008/0149997 | A1 | 6/2008 | Jin et al. |
| 2008/0150025 | A1 | 6/2008 | Jain |
| 2008/0179752 | A1 | 7/2008 | Yamauchi et al. |
| 2008/0191196 | A1 | 8/2008 | Lu et al. |
| 2008/0224224 | A1 | 9/2008 | Vandenderghe et al. |
| 2008/0227259 | A1 | 9/2008 | Avouris et al. |
| 2008/0246021 | A1 | 10/2008 | Suk et al. |
| 2008/0247226 | A1 | 10/2008 | Liu et al. |
| 2008/0290418 | A1 | 11/2008 | Kalburge |
| 2009/0026553 | A1 | 1/2009 | Bhuwalka et al. |
| 2009/0057650 | A1 | 3/2009 | Lieber et al. |
| 2009/0057762 | A1 | 3/2009 | Bangsaruntip et al. |
| 2009/0061568 | A1 | 3/2009 | Bangsaruntip et al. |
| 2009/0090934 | A1 | 4/2009 | Tezuka et al. |
| 2009/0134467 | A1 | 5/2009 | Ishida et al. |
| 2009/0149012 | A1 | 6/2009 | Brask et al. |
| 2009/0181477 | A1 | 7/2009 | King et al. |
| 2009/0217216 | A1 | 8/2009 | Lee et al. |
| 2009/0294864 | A1 | 12/2009 | Suk et al. |
| 2010/0193770 | A1 | 8/2010 | Bangsaruntip et al. |
| 2010/0207102 | A1 | 8/2010 | Lee et al. |
| 2011/0133169 | A1 | 6/2011 | Bangsaruntip et al. |
| 2011/0147840 | A1 | 6/2011 | Cea et al. |

FOREIGN PATENT DOCUMENTS

| | | |
|---|---|---|
| WO | 02084757 A1 | 10/2002 |
| WO | WO2008069765 A1 | 6/2008 |

OTHER PUBLICATIONS

International Search Report—Written Opinion; International Application No. PCT/US2011/029304; International Filing Date: Mar. 22, 2011; Date of Mailing: May 20, 2011.

Alexander J. Gates, "Designing a Nanoelectronic Circuit to Control a Millimeter-scale Walking Robot," Mitre Technical Paper, Aug. 2004, http://www.mitre.org/work/tech_papers/tech_papers_04/04_1248/04_1248.pdf.

Ernst et al., "3D Multichannels and Stacked Nanowires Technologies for New Design Opportunities in Nanoelectronics," IEEE International Conference on Integrated Circuit Design and Technology and Tutorial, 2008. ICICDT 2008. Jun. 2-4, 2008 pp. 265-268.

M. M. Ziegler et al., "The CMOS/NANO Interface from a Circuits Perspective," ISCAS '03. Proceedings of the 2003 International Symposium on Circuits and Systems, 2003, May 25-28, 2003, vol. 4, pp. IV-904-IV-907.

International Search Report; International Application No. PCT/EP2011/053174; International Filing Date: Mar. 3, 2011; Date of Mailing: May 31, 2011.

International Search Report—Written Opinion; International Application No. PCT/EP2011/053174; International Filing Date: Mar. 3, 2011; Date of Mailing: May 31, 2011.

International Search Report; International Application No. PCT/US11/49501; International Filing Date: Aug. 29, 2011; Date of Mailing: Jan. 18, 2012.

International Search Report Written Opinion; International Application No. PCT/US11/49501; International Filing Date: Aug. 29, 2011; Date of Mailing: Jan. 18, 2012.

G.W. Neudeck, "An Overview of Double-Gate MOSFETs," Proceedings of 15th Biennial University/Government/Industry Microelectronics Symposium. UGIM 2003. New York, NY: IEEE, US, Jun. 30-Jul. 2, 2003., Jun. 30, 2003, pp. 214-217.

International Search Report; International Application No. PCT/EP2010/066961; International Filing Date: Nov. 8, 2010; Date of Mailing: Feb. 10, 2011.

International Search Report; International Application No. PCT/EP2010/066483; International Filing Date: Oct. 29, 2010; Date of Mailing: Feb. 7, 2011.

International Search Report—Written Opinion; International Application No. PCT/EP2010/066483; International Filing Date: Oct. 29, 2010; Date of Mailing: Feb. 7, 2011.

International Search Report—Written Opinion; International Application No. PCT/EP2010/066961; International Filing Date: Nov. 8, 2010; Date of Mailing: Feb. 10, 2011.

Pavanello et al., "Evaluation of Triple-Gate FinFETs With SiO2-HfO2-TiN Gate Stack Under Analog Operation," Solid State Electronics, Elsevier Science Publishers, Barking, GB, vol. 51, No. 2, Mar. 7, 2007, pp. 285-291.

Alexander J. Gates, "Designing a Nanoelectronic Circuit to Control a Millimeter-scale Walking Robot," Mitre Technical Paper, Nov. 2004, http://www.mitre.org/work/tech_papers/tech_papers_04/04_1248/04_1248.pdf.

Ernst et al., "3D Multichannels and Stacked Nanowires Technologies for New Design Opportunities in Nanoelectronics," IEEE International Conference on Integrated Circuit Design and Technology and Tutorial, 2008. ICICDT 2008, Jun. 2-4, 2008 pp. 265-268.

Andriotis et al., Realistic nanotube-metal contact configuration for molecular electronics applications, IEEE Sensors Journal, vol. 8, No. 6, Jun. 2008.

R, Bahar, 'Trends and Future Directions in Nano Structure Based Computing and Fabrication', ICCD 2006, International Conf. on Computer Design, Oct. 1-4, 2007, pp. 522-527.

Buddharaju et al., 'Gate-All-Around Si-Nanowire CMOS Inverter Logic Fabricated Using Top-Down Approach', European Solid-State Device Research Conference, Sep. 11-11, 2007, pp. 303-306.

Chen et al., 'Demonstration of Tunneling FETs Based on Highly Scalable Verticle Silicon Nanowires', IEEE Electron Device Letters, vol. 30, No. 7, Jul. 2009, pp. 754-756.

Hu et al., 'Fringing field effects on electrical resistivity of semiconductor nanowire-metal contacts', Applied Physics Letters 92, 083503_2008.

Jie Xiang et al., "Ge/Si Nanowire Heterostructures as High-Performance Field-Effect Transistors," Nature 441, 489-493 (May 25, 2006).

Knoch et al., 'Tunneling phenomena in carbon nanotube field-effect transistors', Phys Stat Sol. (a) 205, No. 4, 679-694 (2008).

Leonard et al., 'Size-dependent effects on electrical contacts to nanotubes and nanowires', Phys Rev Lett., Jul. 14, 2006; 97(2):026804.

M. T. Bjork et al., "Silicon Nanowire Tunneling Field-Effect Transistors," Applied Physics Letters 92, 193504 (2008).

Ma et al., 'High-performance nanowire complementary metal-semiconductor inverters', Applied Physics Letters 93, 053105_2008, Aug. 6, 2008.

Saumitra Raj mehrotra, A Simulation Study of Silicom Nanowire Field Effect Transistors (FETs), University of Cincinnati, Jul. 2007.

Lauhon et al., 'Epitaxial core-shell and core-multishell nanowire heterostructures', Nature, vol. 420, Nov. 7, 2002, pp. 57-61.

Singh et al., 'Si, SiGe Nanowire Devices by Top-Down Technology and Their Applications', IEEE Transactions on Electron Devices, vol. 55, No. 11, Nov. 2008, pp. 3107-3118.

Taichi Su et al., New Planar Self-Aligned Double-Gate Fully Depleted P-MOSFET's Using Epitaxial Lateral Overgrowth (ELO) and Selectively Grown Source/Drain (S/D), Oct. 2000.

N. Checka, 'Circuit Architecture for 3D Integration', Chapter 13 in Wafer Level 3-D ICs Process Technology, ed. C.S. Tan, Springer US, 2008, ISBN 978-0-387-76534-1.

Checka, N., 'Circuit Architecture for 3D Integration', Chapter 13 in Wafer Level 3-D ICs Process Technology, ed. C.S. Tan, Springer US, 2008, ISBN 978-0-387-76534-1.

Chen et al., "An Integrated Logic Circuit Assembled ona Single Carbon Nanotube", www.sciencemag.org Science, vol. 311, Mar. 24, 2006, p. 1735.

Derycke, et al, "Carbon Nanotube Inter- and Intramolecular Logic Gates" Nano Letters, Sep. 2001, vol. 1, No. 9, pp. 453-456.

Office Action—Non-Final for U.S. Appl. No. 12/684,280, filed Jan. 8, 2010; First Named Inventor: Sarunya Bangsaruntip; Mailing Date: May 2, 2011.

Office Action—Non-Final for U.S. Appl. No. 12/778,315; filed May 12, 2010; First Named Inventor: Sarunya Bangsaruntip; Mailing Date: Mar. 26, 2012.

Office Action—Non-Final for U.S. Appl. No. 12/856,718, filed Aug. 16, 2010; first Named Inventor Sarunya Bangsaruntip; Mailing Date: Jul. 9, 2012.

Office Action—Non-Final for U.S. Appl. No. 12/776,485, filed May 10, 2010; Fist Named Inventor: Sarunya Bangsaruntip; Mailing Date: Feb. 21, 2012.

Office Action—Non-Final for U.S. Appl. No. 13/372,719, filed Feb. 14, 2012; First Named Inventor; Sarunya Bangsaruntip; Mailing Date: May 7, 2012.

Office Action—Restriction Election for U.S. Appl. No. 12/684,280, filed Jan. 8, 2010; First Named Inventor: Sarunya Bangsaruntip; Mailing Date: Feb. 10, 2011.

Restriction/Election Office Action for U.S. Appl. No. 12/758,939, filed Apr. 13, 2010; First Named Inventor: Sarunya Bangsaruntip; Mailing Date: Jun. 8, 2012.

Office Action—Restriction Election for U.S. Appl. No. 12/776,485, filed May 10, 2010; First Named Inventor : Sarunya Bangsaruntip; Mailing Date: Dec. 9, 2011.

Office Action—Final for U.S. Appl. No. 12/684,280, filed Jan. 8, 2010; First Namd Inventor: Sarunya Bangsaruntip; Mailing Date: Oct. 5, 2011.

* cited by examiner

A - A

GATE-ALL-AROUND NANOWIRE FIELD EFFECT TRANSISTORS

CROSS REFERENCE TO RELATED APPLICATIONS

This application is related to co-pending application Ser. Nos. 12/631,205, 12/630,942, 12/630,939, 12/631,213, all of which are incorporated by reference herein.

FIELD OF INVENTION

The present invention relates to semiconductor nanowire field effect transistors.

DESCRIPTION OF RELATED ART

A nanowire field effect transistor (FET) includes doped portions of nanowire that contact the channel region and serve as source and drain regions of the device. Previous fabrication methods that used ion-implantation to dope the small diameter nanowire may result in undesirable amorphization of the nanowire or an undesirable junction doping profile.

BRIEF SUMMARY

In one aspect of the present invention, a method for forming a nanowire field effect transistor (FET) device, the method includes forming a suspended nanowire over a semiconductor substrate, forming a gate structure around a portion of the nanowire, forming a protective spacer adjacent to sidewalls of the gate and around portions of nanowire extending from the gate, removing exposed portions of the nanowire left unprotected by the spacer structure, and epitaxially growing a doped semiconductor material on exposed cross sections of the nanowire to form a source region and a drain region.

In another aspect of the present invention, a method for forming a nanowire field effect transistor (FET) device, the method includes forming a suspended nanowire over a semiconductor substrate, forming a gate structure around a portion of the nanowire, forming a protective spacer adjacent to sidewalls of the gate and around portions of nanowire extending from the gate, removing exposed portions of the nanowire, and portions of nanowire to form a cavity defined by the nanowire surrounded by the gate structure, and the spacer walls, and epitaxially growing a doped semiconductor material in the cavity on exposed cross sections of the nanowire.

In yet another aspect of the present invention, a nanowire field effect transistor (FET) device includes a channel region including a silicon portion having a first distal end extending from the channel region and a second distal end extending from the channel region, the silicon portion is partially surrounded by a gate structure disposed circumferentially around the silicon portion, a source region including a first doped epi-silicon nanowire extension contacting the first distal end of the silicon portion, and a drain region including a second doped epi-silicon nanowire extension contacting the second distal end of the silicon portion.

In yet another aspect of the present invention, a nanowire field effect transistor (FET) device includes a channel region including a silicon portion having a first distal end and a second distal end, the silicon portion is surrounded by a gate structure disposed circumferentially around the silicon portion, a first cavity defined by the first distal end of the silicon portion and an inner diameter of the gate structure, a second cavity defined by the second distal end of the silicon portion and an inner diameter of the gate structure, a source region including a first doped epi-silicon nanowire extension contacting the first distal end of the silicon portion in the first cavity, and a drain region including a second doped epi-silicon nanowire extension contacting the second distal end of the silicon portion in the second cavity.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

Figure 1:
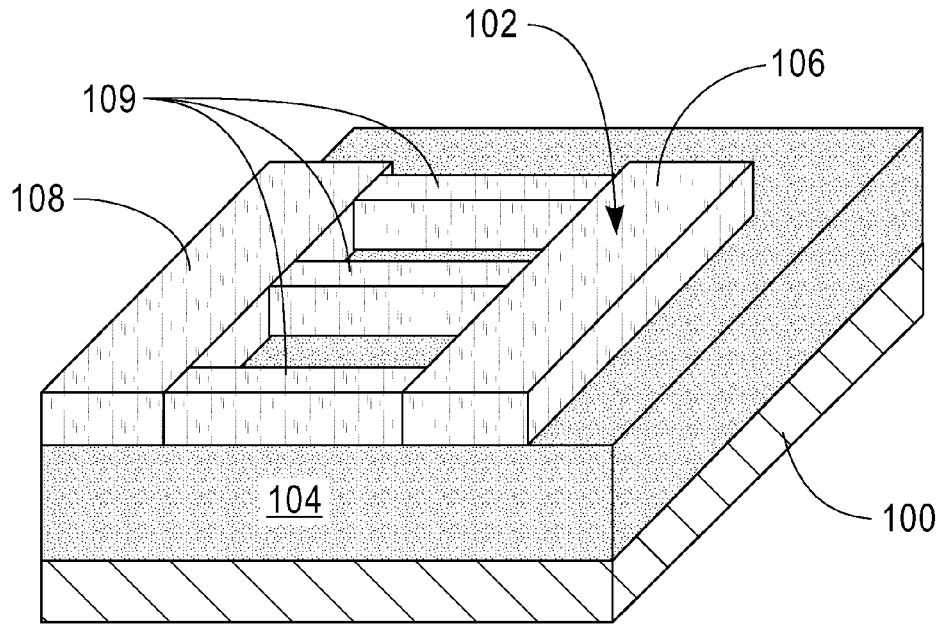
FIGS. 1-13B illustrate an exemplary method for forming field effect transistor (FET) devices.

With reference now to FIG. 1, a silicon on insulator (SOI) portion 102 is defined on a buried oxide (BOX) layer 104 that is disposed on a silicon substrate 100. The SOI portion 102 includes a SOI pad region 106, a SOI pad region 108, and nanowire portions 109. The SOI portion 102 may be patterned by the use of lithography followed by an etching process such as, for example, reactive ion etching (RIE).

Figure 2:
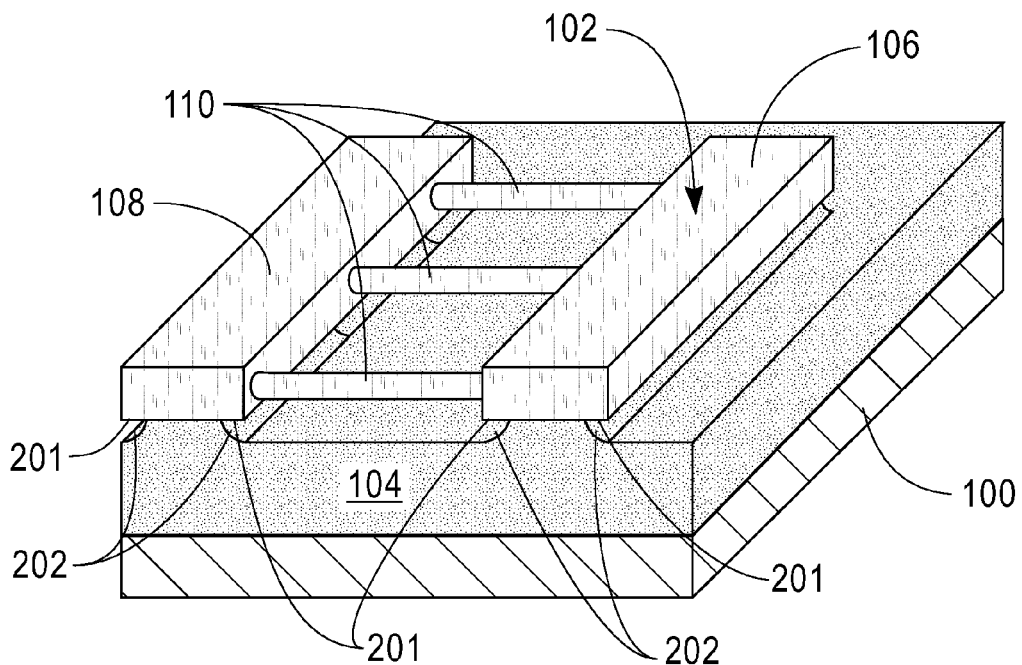

FIG. 2 illustrates the resultant BOX layer 104 and SOI portion 102 following an isotropic etching process. The BOX layer 104 is recessed in regions not covered by SOI portion 102. The isotropic etching results in the lateral etching of portions of the BOX layer 104 that are under the SOI portion 102. The lateral etch suspends the nanowires 109 above the BOX layer 104. The lateral etch forms the undercuts 202 in the BOX layer 104 and overhang portions 201 at the edges of SOI regions 106 and 108. The isotropic etching of the BOX layer 104 may be, for example, performed using a diluted hydrofluoric acid (DHF). A 100:1 DHF etches about 2 to 3 nm of BOX layer 104 per minute at room temperature. Following the isotropic etching the nanowires portions 109 are smoothed to form elliptical shaped (and in some cases, cylindrical shaped) nanowires 110 that are suspended above the BOX layer 104 by the SOI pad region 106 and the SOI pad region 108. The smoothing of the nanowires may be performed by, for example, annealing of the nanowires 109 in hydrogen. Example annealing temperatures may be in the range of 600° C.-900° C., and a hydrogen pressure of approximately 600 torr to 7 torr.

Figure 3:
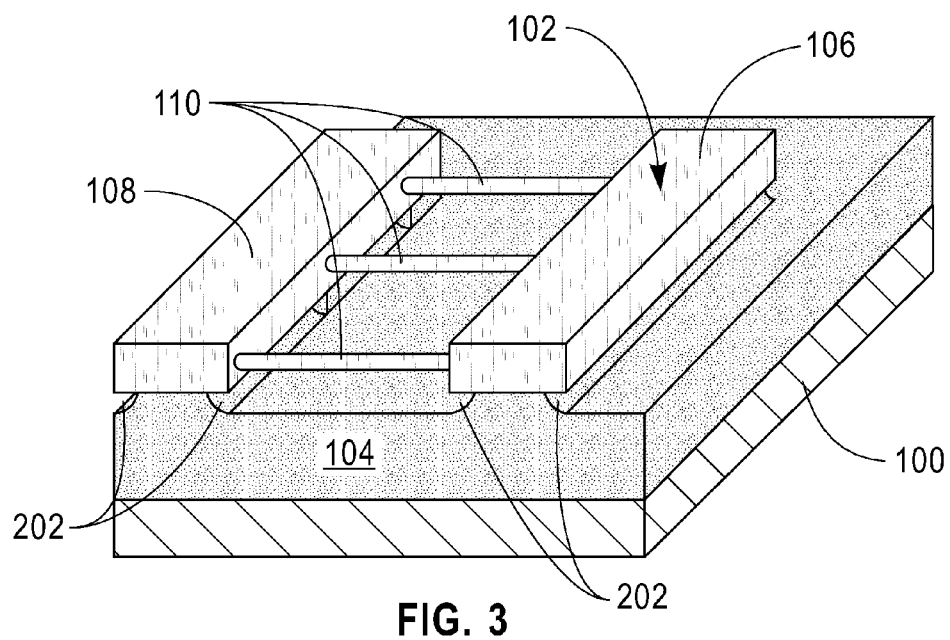

FIG. 3 illustrates the nanowires 110 following an oxidation process that reduces the diameter of the nanowires 110. The reduction of the diameter of the nanowires 110 may be performed by, for example, an oxidation of the nanowires 110 followed by the etching of the grown oxide. The oxidation and etching process may be repeated to achieve a desired nanowire 110 diameter. Once the diameters of the nanowires 110 have been reduced, gates are formed over the channel regions of the nanowires 110 (described below).

Figure 4A:
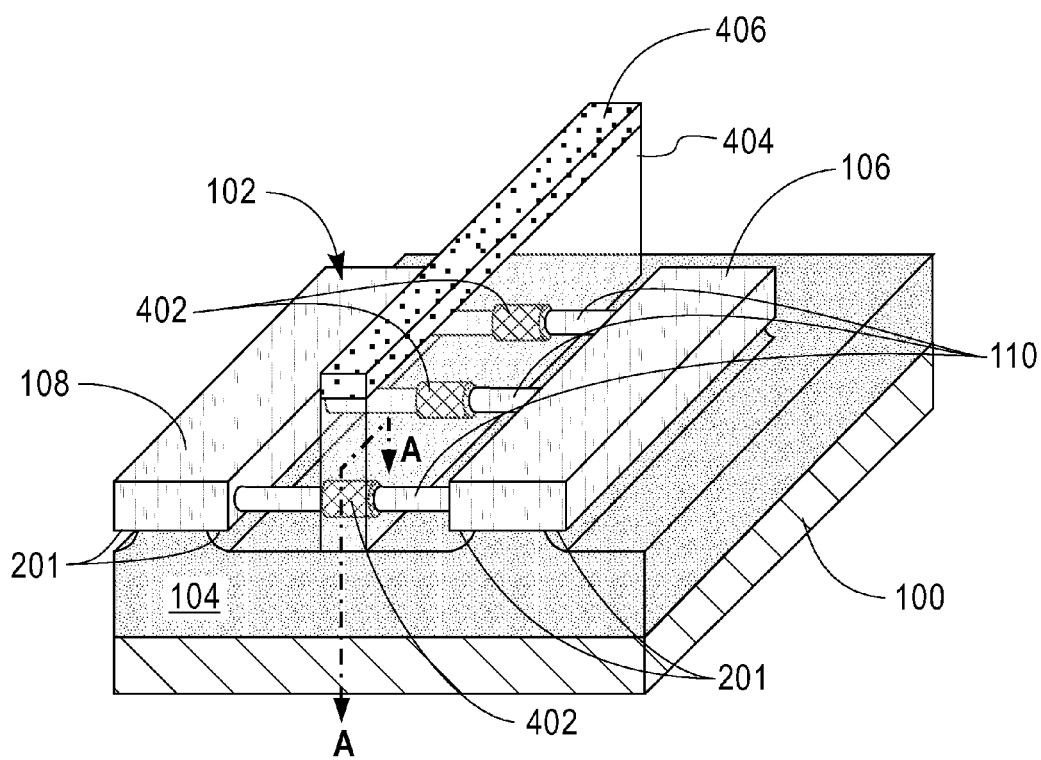

FIG. 4A illustrates gates 402 that are formed around the nanowires 110, as described in further detail below, and capped with a polysilicon layer (capping layer) 404. A hardmask layer 406, such as, for example silicon nitride ($Si_3N_4$) is deposited over the polysilicon layer 404. The polysilicon layer 404 and the hardmask layer 406 may be formed by depositing polysilicon material over the BOX layer 104 and the SOI portion 102, depositing the hardmask material over the polysilicon material, and etching by RIE to form the polysilicon layer 406 and the hardmask layer 404 illustrated in FIG. 4A. The etching of the gate 402 may be performed by directional etching that results in straight sidewalls of the gate 402. Following the directional etching, polysilicon 404 remains under the nanowires 110 and outside the region encapsulated by the gate 402. Isotropic etching may be performed to remove polysilicon 404 from under the nanowires 110.

Figure 4B:
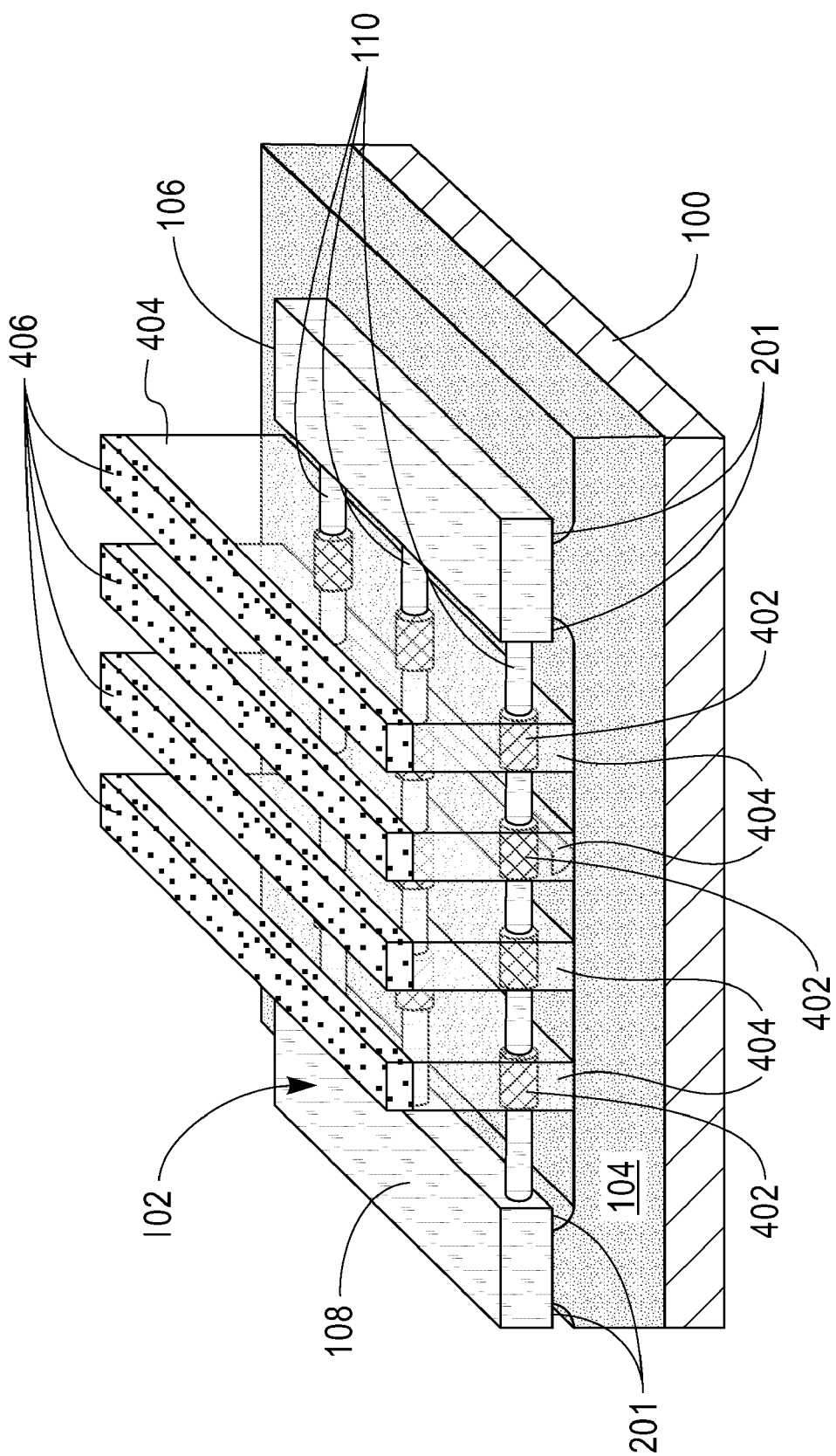

FIG. 4B illustrates a perspective view of an exemplary alternate arrangement that includes a plurality of gates 402 that are formed on a nanowire 110 between SOI pad regions 106 and 108. The fabrication of the arrangement shown in FIG. 4B may be performed using similar methods as described above for the fabrication of a single row of gates 402 line, and illustrates how the methods described herein may be used to form any number of devices on a nanowire between SOI pad regions 106 and 108.

Figure 5:
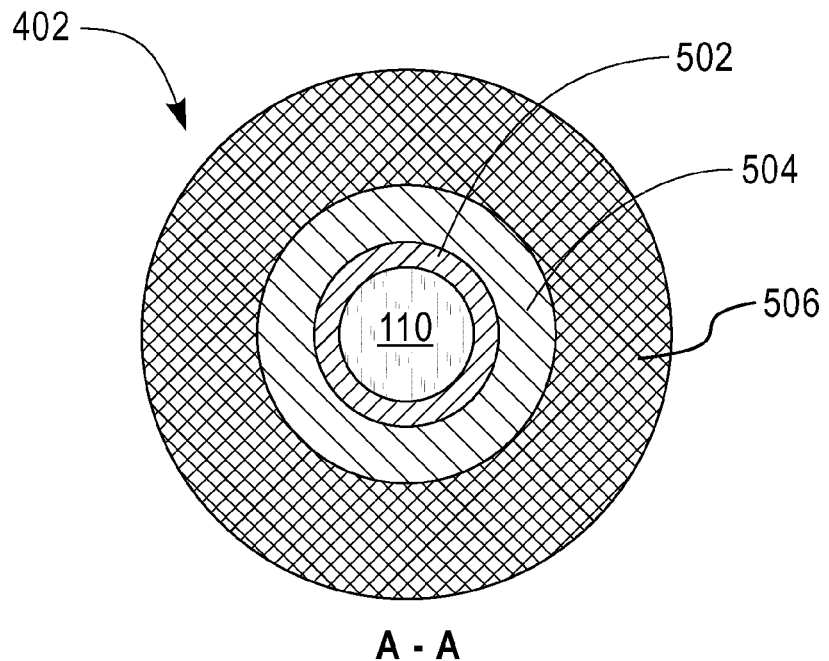

FIG. 5 illustrates a cross sectional view of a gate 402 along the line A-A (of FIG. 4A). The gate 402 is formed by depositing a first gate dielectric layer 502, such as silicon dioxide ($SiO_2$) around a channel portion of the nanowire 110. A second gate dielectric layer 504 such as, for example, hafnium oxide ($HfO_2$) is formed around the first gate dielectric layer 502. A metal layer 506 such as, for example, tantalum nitride (TaN) is formed around the second gate dielectric layer 504. The metal layer 506 is surrounded by polysilicon layer 404 (of FIG. 4A). Doping the polysilicon layer 404 with impurities such as boron (p-type), or phosphorus (n-type) makes the polysilicon layer 404 conductive.

Figure 6A:
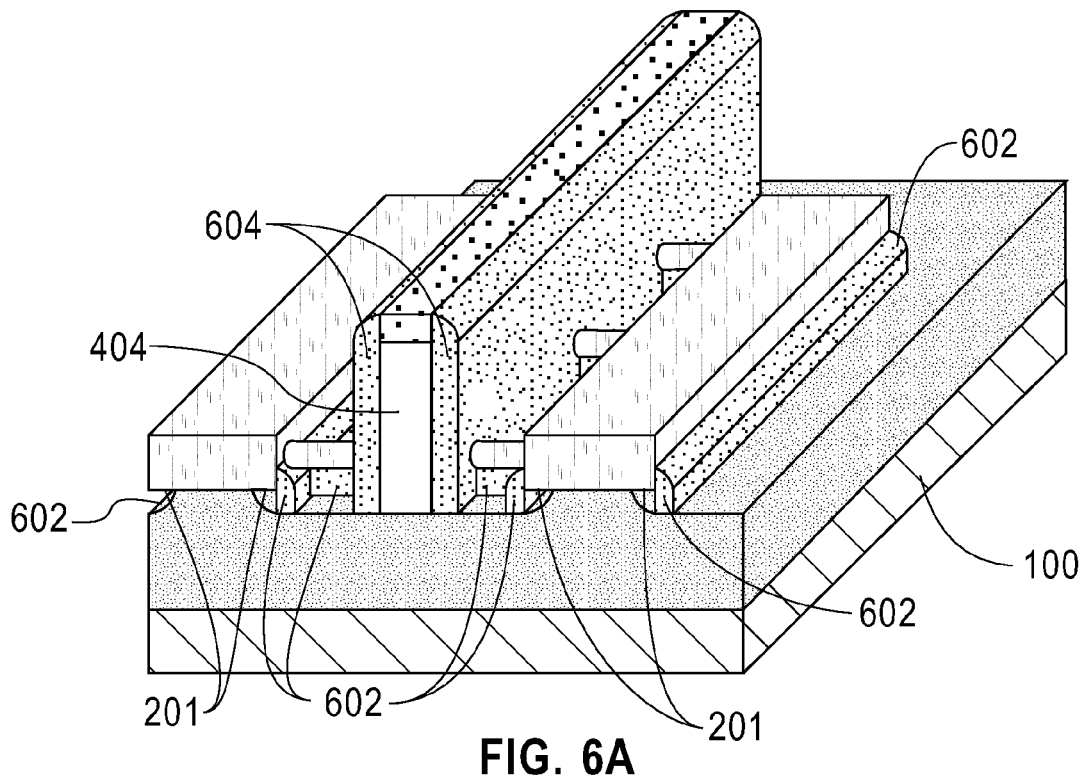
Figure 6B:
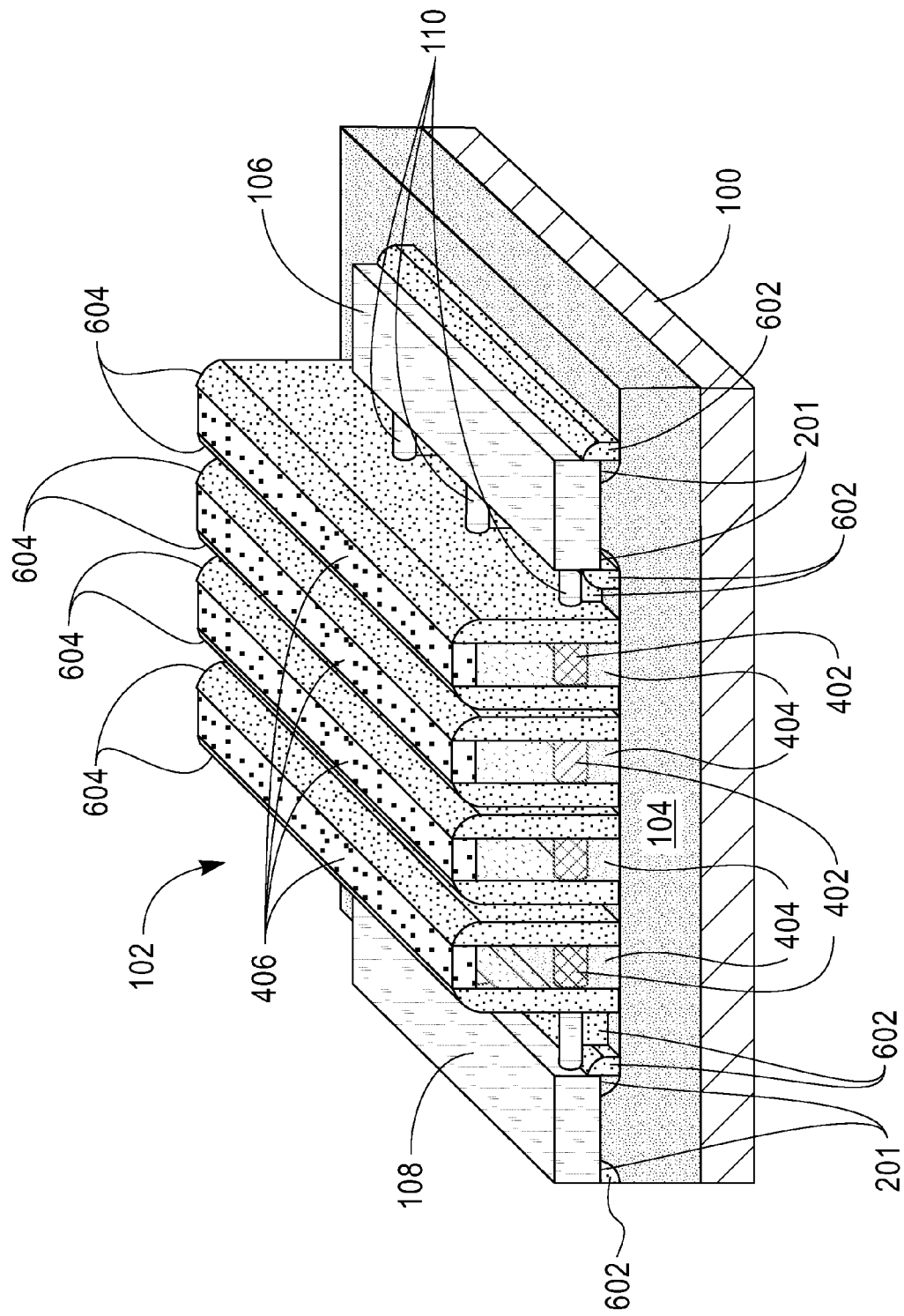

FIGS. 6A and 6B illustrate the spacer portions 604 formed along opposing sides of the polysilicon layer 404. The spacers are formed by depositing a blanket dielectric film such as silicon nitride and etching the dielectric film from all horizontal surfaces by RIE. The spacer walls 604 are formed around portions of the nanowire 110 that extend from the polysilicon layer 404 and surround portions of the nanowires 110. FIGS. 6A and 6B include spacer portions 602 that are formed under the nanowires 110, and in the undercut regions 202 (of FIG. 2).

Figure 7A:
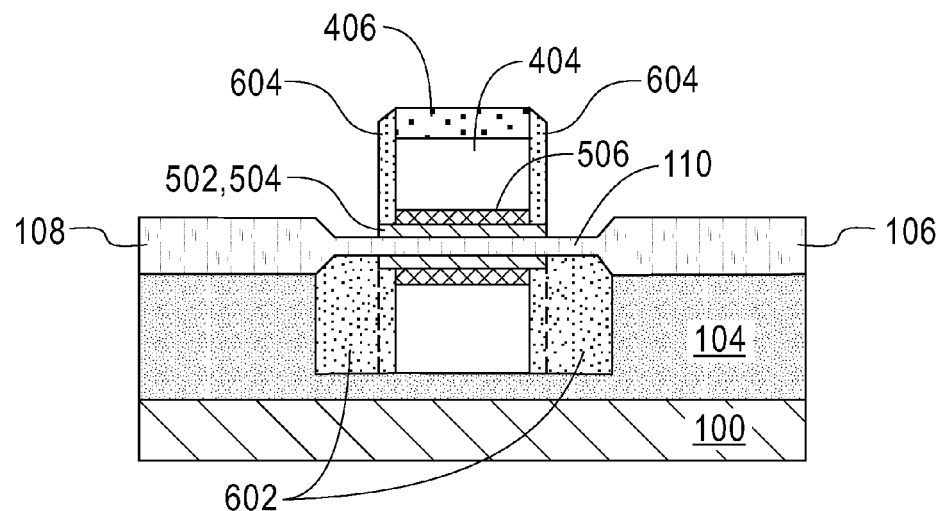
Figure 7B:
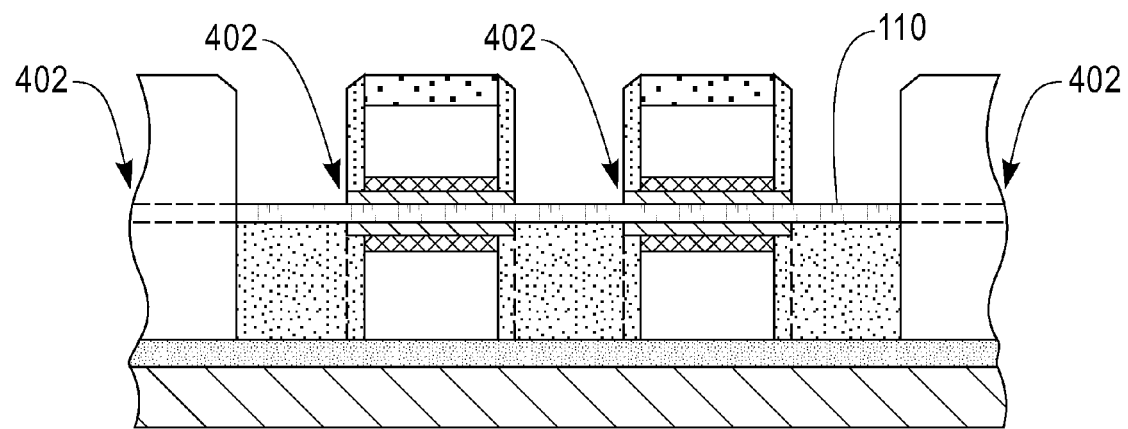

FIG. 7A illustrates a cross-sectional view (of FIG. 6A). FIG. 7B illustrates a similar cross-sectional view of the exemplary alternate arrangement of FIG. 6B.

Figure 8A:
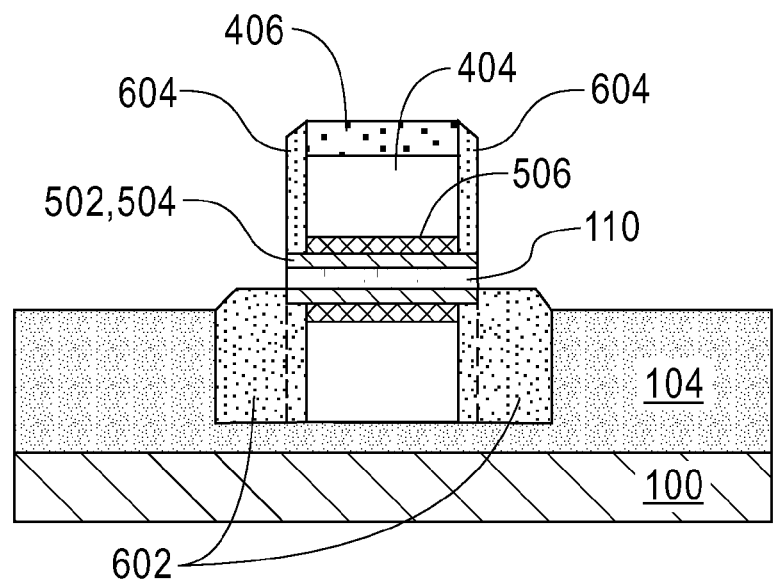
Figure 8B:
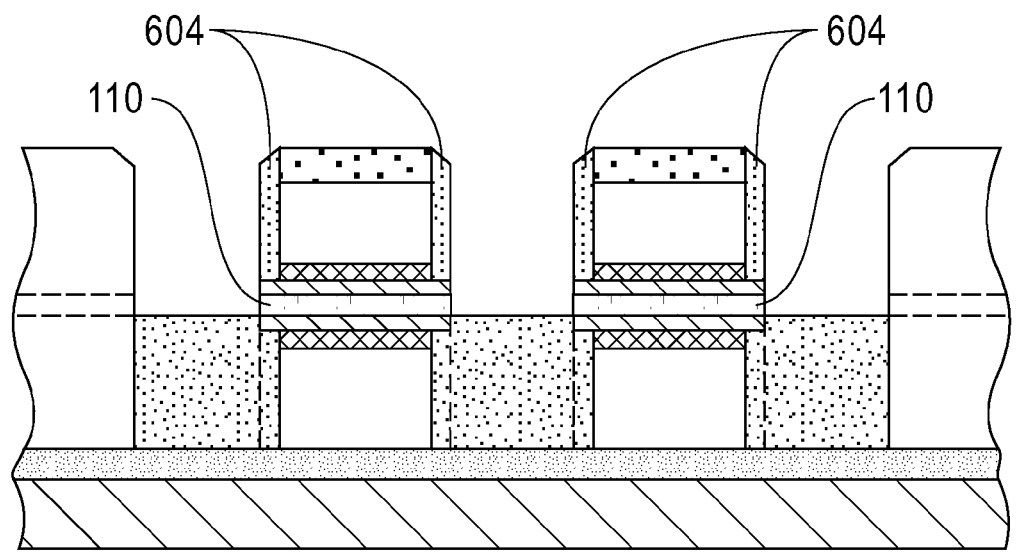

FIGS. 8A and 8B illustrate cross-sectional views of the resultant structures following a selective RIE process, that removes exposed portions of the nanowires 110 and the SOI pad regions 106 and 108 (shown in FIG. 7A). An example of a selective RIE process includes a RIE based on HBr chemistry that etches silicon while being selective to reduce the etching of dielectrics such as silicon oxide and silicon nitride. The portions of the nanowire 110 that are surrounded by the spacer walls 604 are not etched, and have exposed cross sections defined by the spacer walls 604.

Figure 9A:
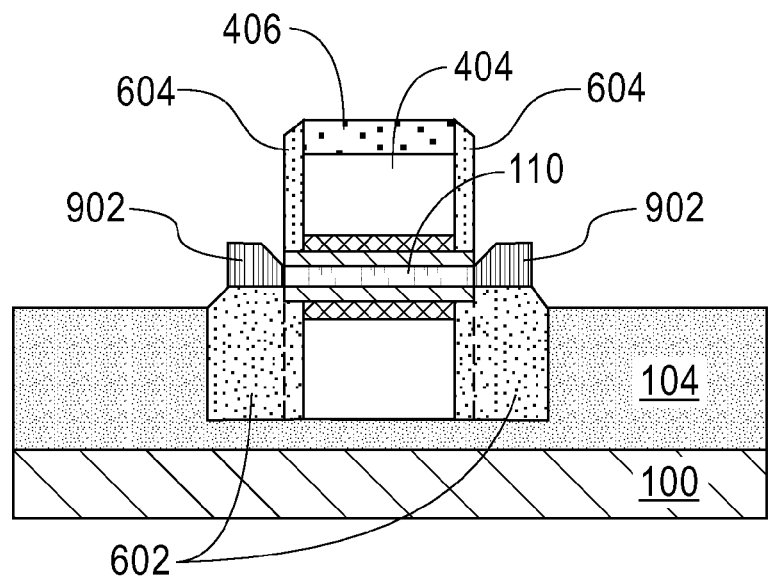
Figure 9B:
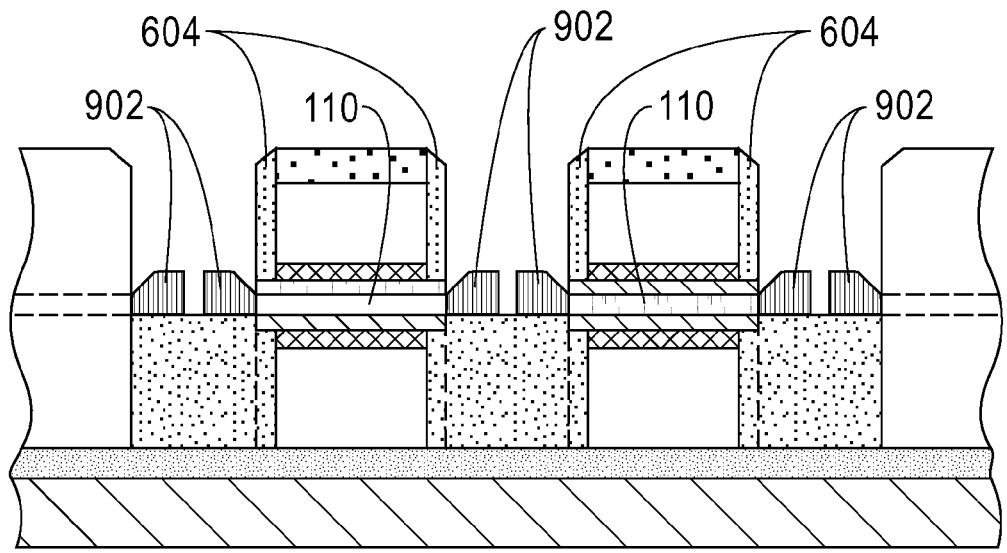

FIGS. 9A and 9B illustrate cross-sectional views of the resultant structures following a selective epi-silicon growth to form epi-nanowire extensions 902 (nanowire extensions). The nanowire extensions 902 are epitaxially grown from the exposed cross-sectional portions of the nanowire 110 that are surrounded by the spacer walls 604. The nanowire extensions 902 are formed by epitaxially growing, for example, in-situ doped silicon (Si) or a silicon germanium (SiGe) that may be either n-type or p-type doped. The in-situ doped epi process forms the source region and the drain region of the nanowire FET. As an example, a chemical vapor deposition (CVD) reactor may be used to perform the epitaxial growth. Precursors for silicon epitaxy include $SiCl_4$, $SiH_4$ combined with HCL. The use of chlorine allows selective deposition of silicon only on exposed silicon surfaces. A precursor for SiGe may be $GeH_4$, which may obtain deposition selectivity without HCL. Precursors for dopants may include $PH_3$ or $AsH_3$ for n-type doping and $B_2H_6$ for p-type doping. Deposition temperatures may range from 550° C. to 1000° C. for pure silicon deposition, and as low as 300° C. for pure Ge deposition.

Figure 10A:
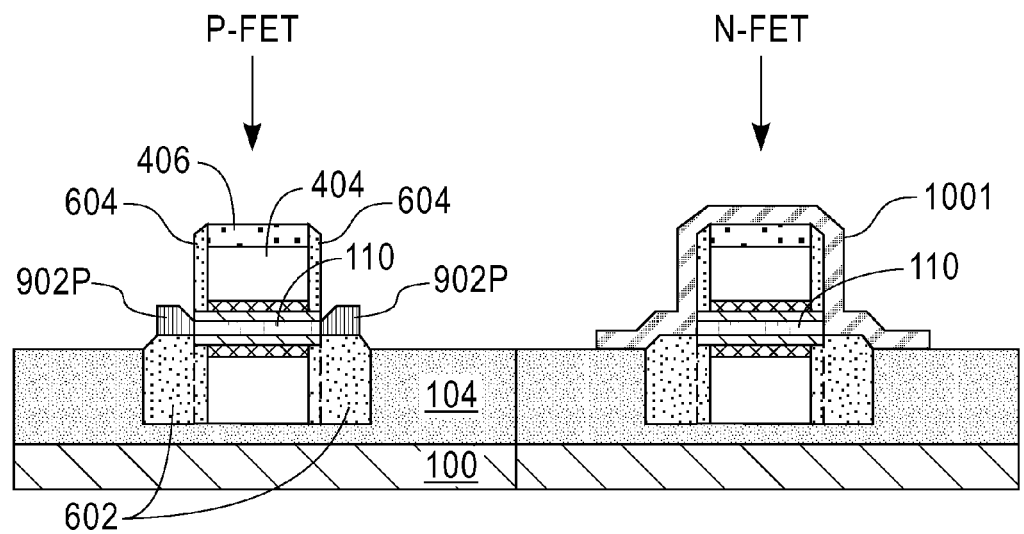
Figure 10B:
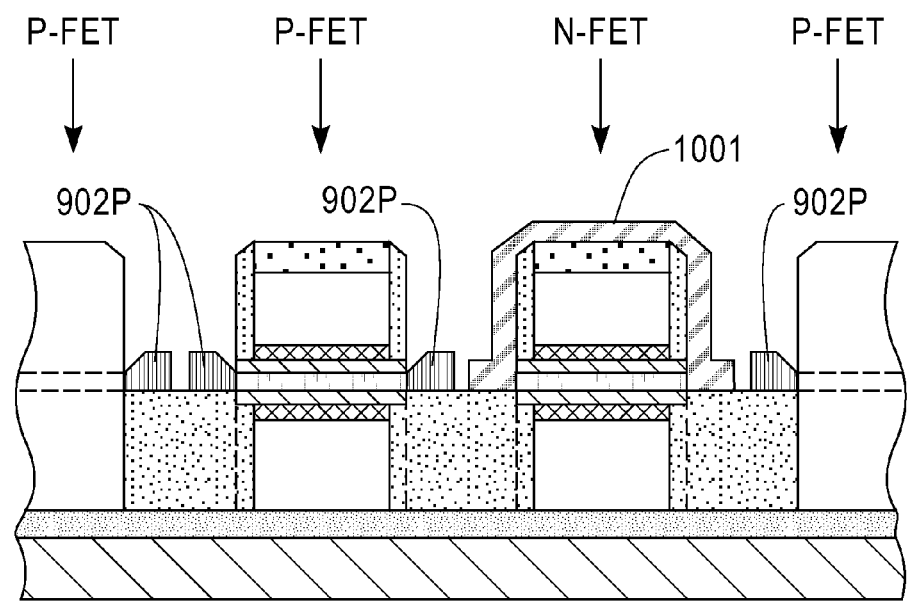

FIGS. 10A-11B illustrate an exemplary method for fabricating complementary metal-oxide-semiconductors (CMOS) having both N-FETs and P-FETs fabricated on the same chip. Since N-FETs and P-FETs have nanowire extensions with different types of dopants, the N-FET device and P-FET device nanowire extensions are grown in separately. Referring to FIG. 10A, a P-FET and N-FET device is shown. The N-FET is covered with an epi blocking mask 1001 that blocks the growth from the exposed cross-sectional portions of the nanowire 110. The epi blocking mask 1001 may be, for example, a deposited oxide film that is patterned to cover the N-FET devices. The P-FET cross-sectional portions of the nanowire 110 are exposed allowing the formation of the p+ doped nanowire extensions 902P using a selective epitaxially grown silicon deposition process similar to the process described above. FIG. 10B illustrates a similar process as described in FIG. 10A for a plurality of N-FET and P-FET devices.

Figure 11A:
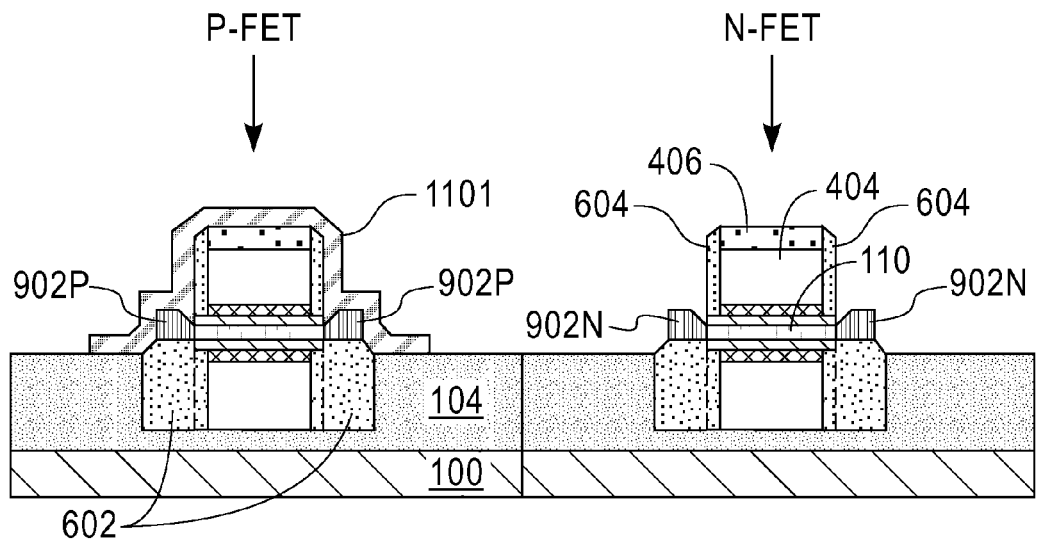
Figure 11B:
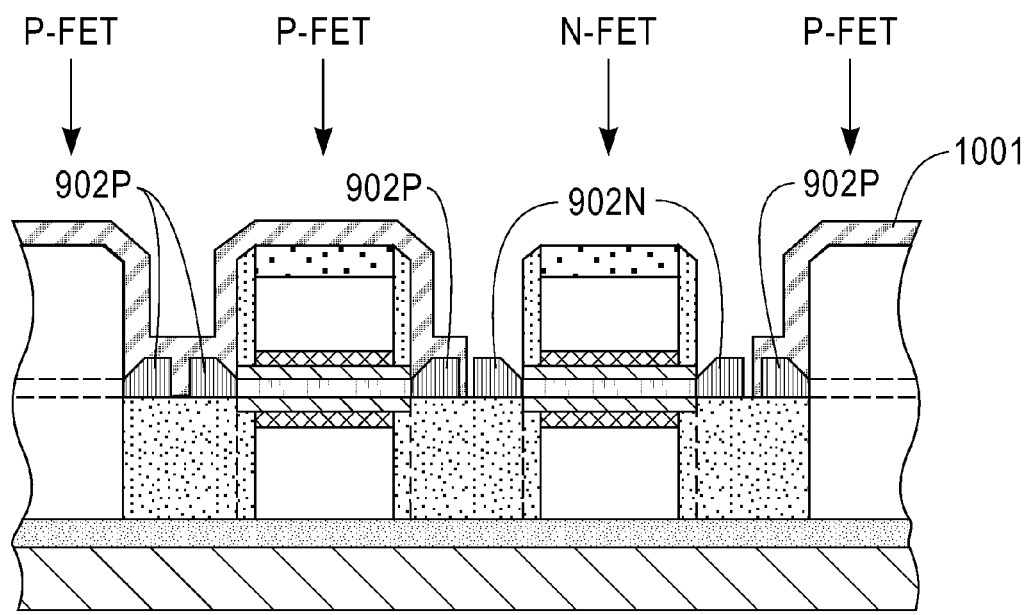

Referring to FIGS. 11A and 11B, following the growth of the p+ doped nanowire extensions 902P (in FIGS. 10A and 10B), the epi blocking masks 1001 are removed, and a second epi blocking mask 1101 is deposited and patterned to cover the P-FET and the p+ doped nanowire extensions 902P. Selective epitaxy with n-type in-situ doping is used to form the n+ doped nanowire extensions 902N. Once the n+ doped nanowire extensions 902N are formed, the second epi blocking mask 1101 may be removed. The order by which the P-FET and N-FET nanowire extensions 902 are formed may be chosen to minimize diffusion of dopants in the first grown extension during the growth of the second nanowire extension. Thus, the epitaxy of the n+ doped nanowire extensions 902N may be formed prior to forming the p+ doped nanowire extensions 902P. Since the formation of the nanowire extensions 902 may be carried out in separate processing steps, the extensions composition may be different. For example, SiGe nanowire extensions may be formed for the P-FET devices while pure silicon nanowire extensions may be formed for the N-FET devices.

Figure 12A:
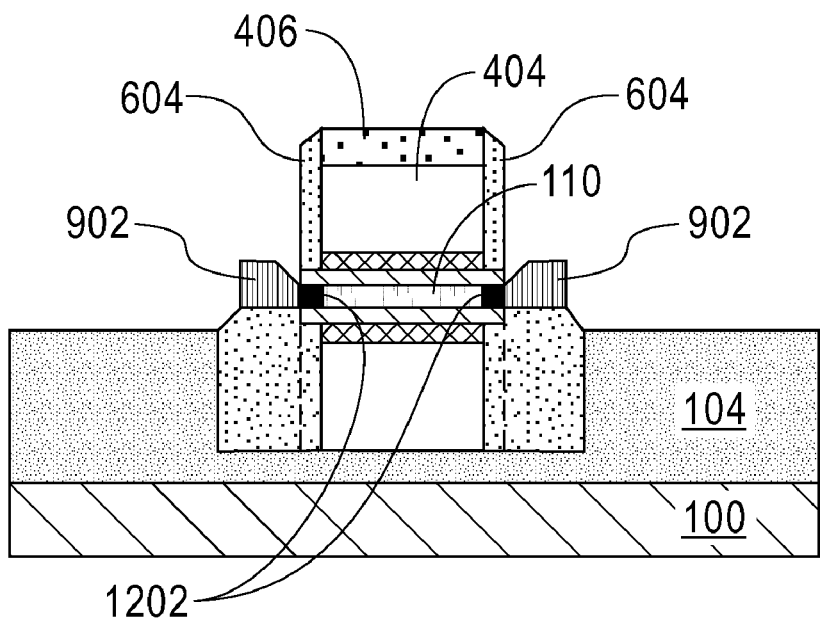
Figure 12B:
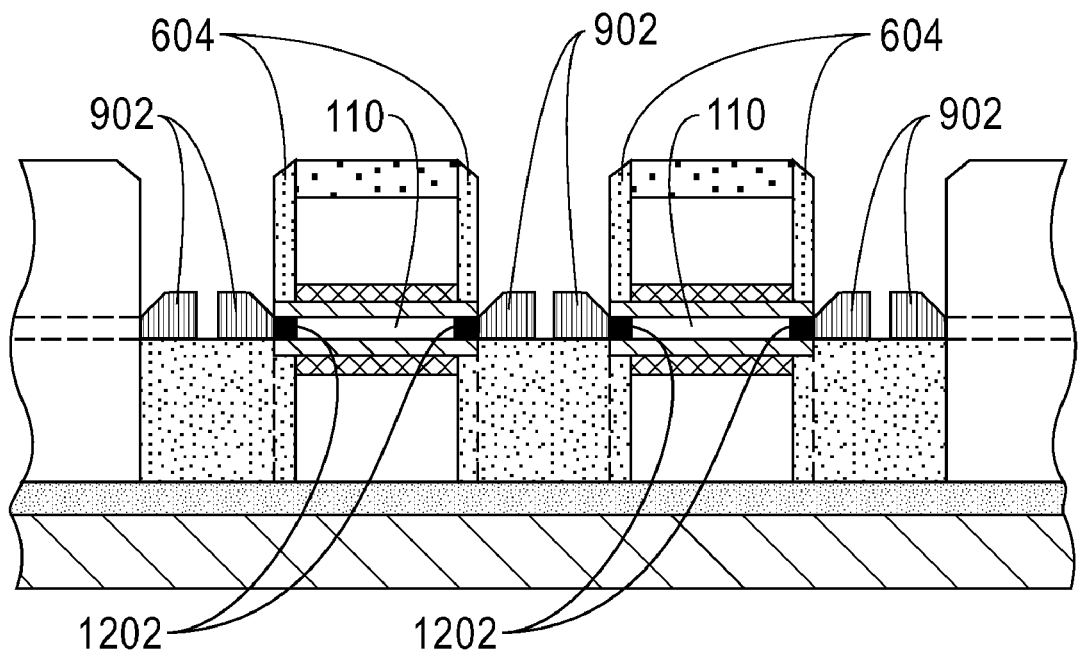

FIGS. 12A and 12B illustrate an example of the resultant structures following a thermal process (performed after the growth of the nanowire extensions 902 described above) that diffuses the doped ions from the nanowire extensions 902 into the regions 1202 of the nanowires 110 that are surrounded by the spacer walls 604 and the gates 404 to overlap the device. The epi-nanowire extensions 902 are uniformly doped when grown; resulting in a uniform doping profile in the regions 1202 of the nanowires 110 following diffusion of the ions from the epi-nanowire extension 902 into the regions 1202. For the CMOS devices (described above in FIGS. 10A-11B), a similar thermal process may be performed. When the n-type and p-type dopant diffusion properties are similar, similar doped regions of the nanowires 110 for both PFET and NFET devices will result. When the n-type and p-type dopant diffusion properties are dissimilar, the penetration of the n-type and p-type dopants may result in dissimilar regions 1202 in the nanowires 110. The thermal process may be performed in a rapid thermal annealing (RTA) chamber. The thermal process may be performed, for example, at annealing temperatures between 900° C. to 1100° C. for 0-10 seconds in an ambient N₂ gas. The annealing temperature rate may range, for example, between 50° C./second to 300° C./second.

Figure 13A:
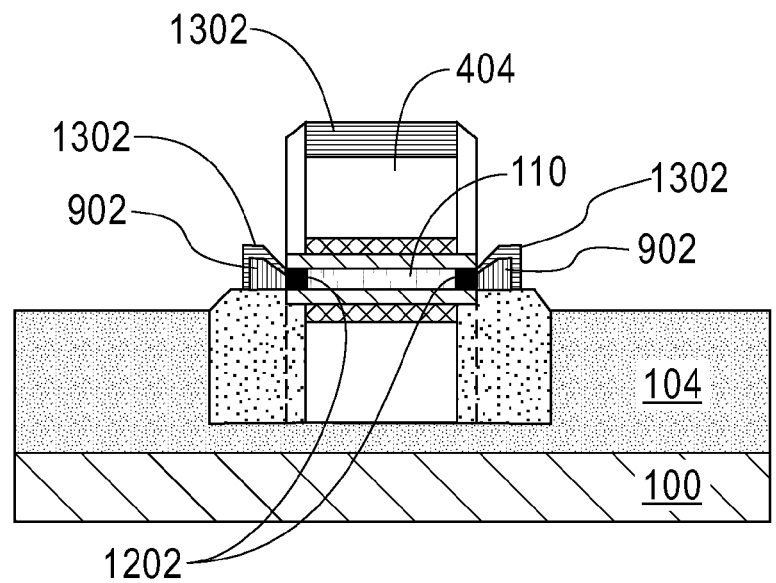
Figure 13B:
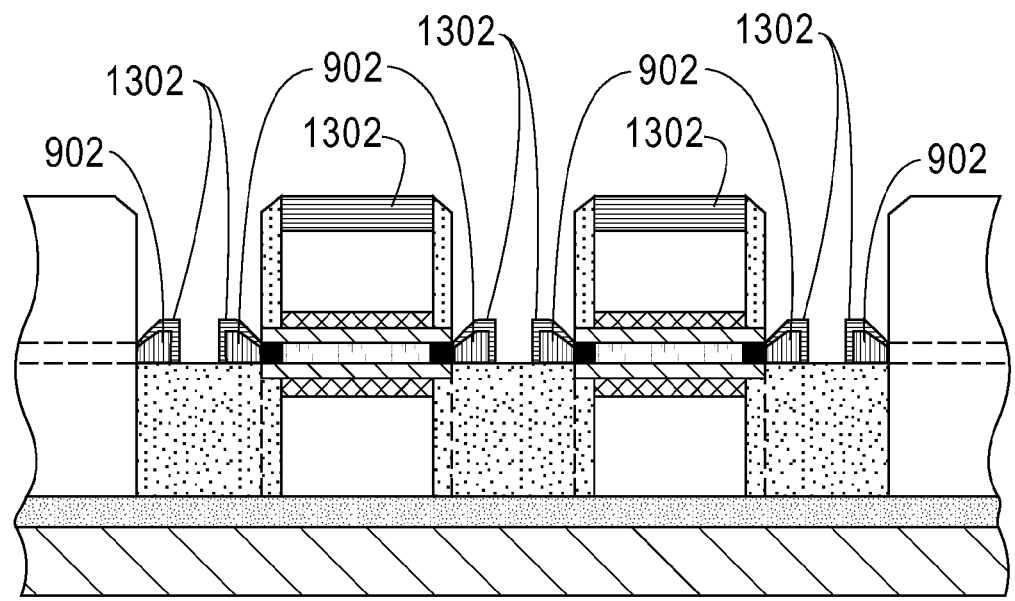

FIGS. 13A and 13B illustrate a resultant structure following silicidation where a silicide 1302 is formed on the nanowire extensions 902, and over the polysilicon layer 404. Examples of silicide forming metals include Ni, Pt, Co, and alloys such as NiPt. When Ni is used the NiSi phase is formed due to its low resistivity. For example, formation temperatures include 400-600° C. Once the silicidation process is performed, capping layers and vias for connectivity (not shown) may be formed.

Figure 14A:
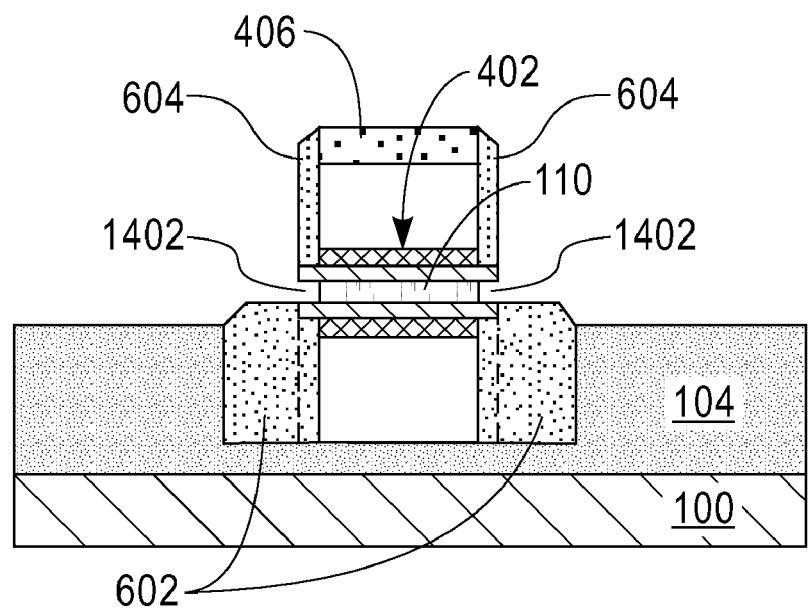
FIGS. 14A-15B illustrate an alternate exemplary method for forming field effect transistor (FET) devices.
Figure 14B:
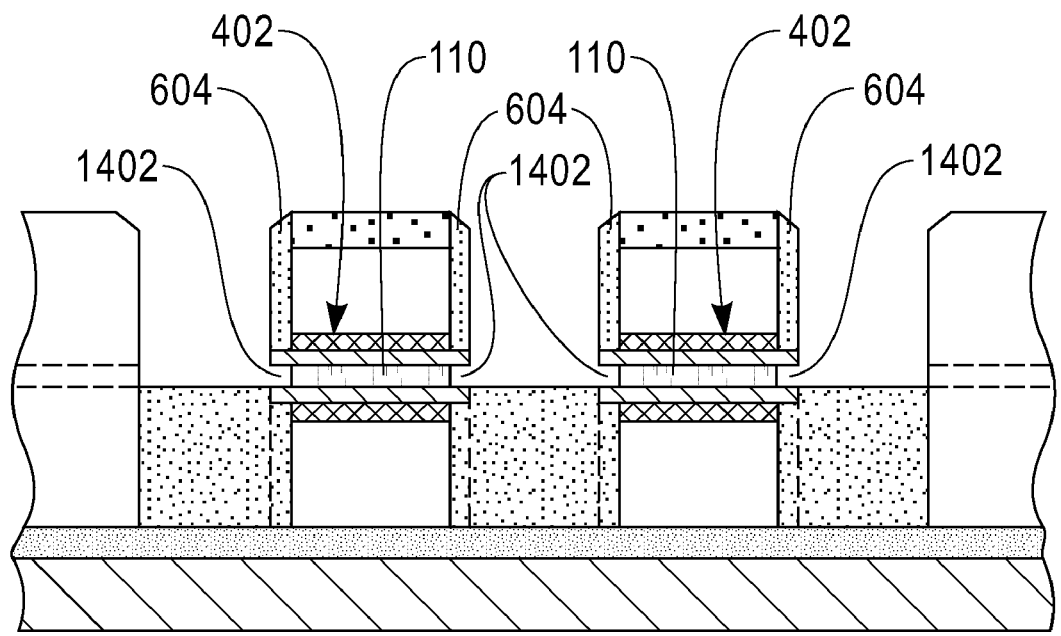

FIGS. 14A-15B illustrate an alternate exemplary method for forming a nanowire FET. The alternate exemplary method is similar to the method described above in FIGS. 1-13B. However, when the nanowires 110 are etched to remove the exposed portions of the nanowires 110, the etching process removes a portion of the nanowires 110 that are surrounded by the spacer walls 604 and the gates 402 to recess the nanowires 110 into the gates 402, and form cavities 1402 defined by the gates 402, the nanowires 110 and the spacer walls 604. FIGS. 14A and 14B illustrate a cross-sectional view of the resultant structure.

The lateral etching process that forms cavities 1402 may be time based. Width variation in spacer 604 may lead to variations in the position of the edges of the recessed nanowires 110. The etching rate in the cavity 1402 depends on the size of the cavity, with narrower orifice corresponding to slower etch rates. Variations in the nanowire size will therefore lead to variations in the depth of cavity 1402.

The variations described above may be reduced by bombarding the exposed ends of nanowire 110 with ions (e.g. silicon ions, germanium ions, and even dopants such as boron which do not amorphize) prior to the formation of the spacer 604 (in FIGS. 6A and 6B). The etching rate of the bombarded portions of nanowires 110 is several times faster than that of the un-exposed portion of nanowire 110 protected by gate material 402. As a result, the cavity 1402 becomes self-aligned with the sidewalls of gate 402 when etched.

If the deposition of spacer 604 is performed at an elevated temperature, the deposition process may anneal the exposed nanowire 110 portions (that have been bombarded with ions) and increase the etching resistance of the exposed nanowire 110 portion. For silicon nanowires 110, the spacer 604 may be formed at a low temperature, for example, less than 500° C. to avoid annealing the bombarded portions of the nanowires 110. If other materials are used to form the nanowires 110 are used, the formation temperature of the spacer 604 may be higher. An alternative that accommodates high temperature deposition of spacer 604 includes performing an ion implantation at an oblique angle to the substrate 100 after the deposition of the spacer 604 with an ion energy that damages the portions of the nanowires 110 that are encapsulated by spacer 604.

Figure 15A:
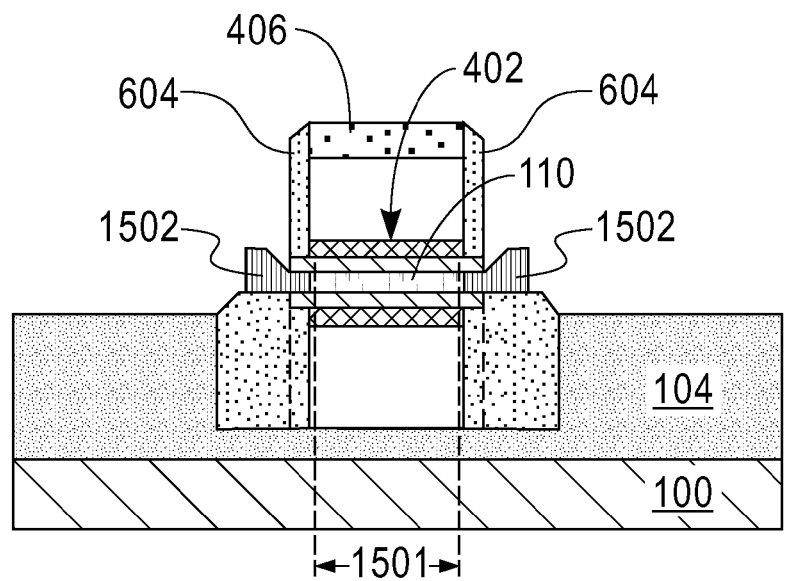
Figure 15B:
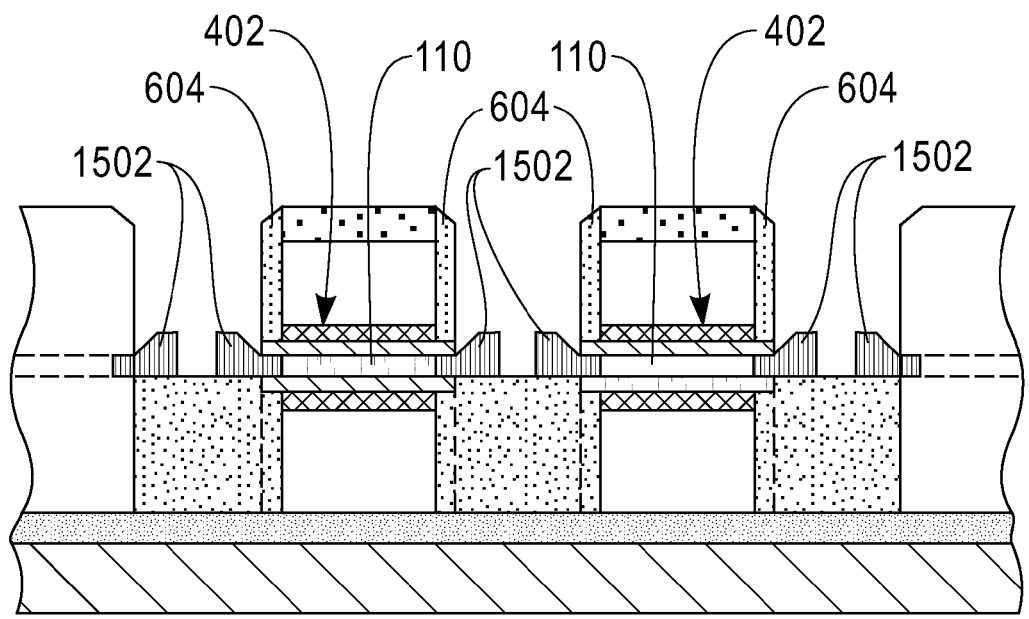

Referring to FIGS. 15A and 15B, a cross-sectional view of the resultant structure having nanowire extensions 1502 that are formed from an in-situ doped epi-silicon growth process similar to the process described above in FIGS. 9A and 9B. The epi silicon growth began in the cavity 1402 (of FIGS. 14A and 14B) from the exposed nanowire 110 in the gate 402 to form the nanowire extensions 1502. Once nanowire extensions 1502 are formed, the doping may be activated by, for example, a laser or flash anneal process. The laser or flash annealing may reduce diffusion of ions into the channel region 1501 of the gate 402, and result in a high uniform concentration of doping in the nanowire extensions 1502 with an abrupt junction in the nanowires 110. Once the ions have been activated, silicidation similar to the process described in FIGS. 13A and 13B above may be performed and capping layers and vias for connectivity (not shown) may be formed.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated The diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A method for forming a nanowire field effect transistor (FET) device, the method comprising:
   forming a suspended nanowire over a semiconductor substrate;
   forming a first gate structure around a first portion of the nanowire;
   forming a first protective spacer adjacent to sidewalls of the first gate structure and around portions of the nanowire extending from the first gate structure;
   removing exposed portions of the nanowire left unprotected by the first spacer; and
   epitaxially growing a doped semiconductor material on exposed cross sections of the nanowire to form a first source region and a first drain region.

2. The method of claim 1, wherein the method further includes:
   forming a second gate structure around a second portion of the nanowire;
   forming a second protective spacer adjacent to sidewalls of the second gate structure and around portions of the nanowire extending from the second gate structure;
   removing exposed portions of the nanowire left unprotected by the second spacer;
   depositing a first protective mask over the second gate structure and the second protective spacer prior to epitaxially growing a doped semiconductor material on exposed cross sections of the nanowire to form the first source region and the first drain region;
   removing the first protective mask;

depositing a second protective mask over the first gate structure, the first protective spacer, the first source region, and the first drain region; and epitaxially growing a doped semiconductor material on exposed cross sections of the nanowire of the second gate structure to form a second source region and a second drain region.

3. The method of claim 1, wherein the epitaxially grown doped semiconductor material is an n-type doped material.

4. The method of claim 1, wherein the epitaxially grown doped semiconductor material is a p-type doped material.

5. The method of claim 2, wherein the epitaxially grown doped semiconductor material of the first source region and the first drain region is a p-type doped material.

6. The method of claim 2, wherein the epitaxially grown doped semiconductor material of the second source region and the second drain region is an n-type doped material.

7. The method of claim 1, wherein the epitaxially grown doped semiconductor material is silicon.

8. The method of claim 1, wherein the epitaxially grown doped semiconductor material is a SiGe alloy.

9. The method of claim 1, wherein the first gate structure includes a silicon oxide layer disposed on a channel portion of the nanowire, a dielectric layer disposed on the silicon oxide layer, and a metal layer disposed on the dielectric layer.

10. The method of claim 1, wherein the first gate structure is formed in circumferential layers surrounding the gate portion of the nanowire.

11. The method of claim 1, wherein the first protective spacer includes a nitride material.

12. The method of claim 1, wherein the epitaxially grown doped semiconductor material is an in-situ doped material.

13. The method of claim 1, wherein the epitaxially grown doped semiconductor material is uniformly doped.

14. The method of claim 1, wherein the method further comprises heating the device to diffuse dopants from the doped semiconductor material into portions of the nanowire.

15. A method for a nanowire field effect transistor (FET) device, the method comprising:
   forming a suspended nanowire over a semiconductor substrate;
   forming a gate structure around a portion of the nanowire;
   forming a protective spacer adjacent to sidewalls of the gate structure and around portions of the nanowire extending from the gate structure;
   removing exposed portions of the nanowire to form a cavity defined by the nanowire surrounded by the gate structure and the spacer; and
   epitaxially growing a doped semiconductor material in the cavity from exposed cross sections of the nanowire.

16. The method of claim 15, wherein the method further includes implanting exposed portions of the nanowire with ions prior to forming a protective spacer adjacent to sidewalls of the gate and around portions of nanowire extending from the gate.

17. The method of claim 15, wherein the method further includes implanting exposed portions of the nanowire with ions to increase the etching rate properties of the exposed portions of the nanowire prior to forming a protective spacer adjacent to sidewalls of the gate and around portions of nanowire extending from the gate.

18. The method of claim 15, wherein the protective spacer adjacent to sidewalls of the gate and around portions of nanowire extending from the gate is formed at a temperature less than 500 degrees Celsius.

19. The method of claim 15, wherein the epitaxially grown doped semiconductor material is an n-type doped material.

20. The method of claim 15, wherein the epitaxially grown doped semiconductor material is a p-type doped material.

21. The method of claim 15, wherein the epitaxially grown doped semiconductor material is silicon.

22. The method of claim 15, wherein the epitaxially grown doped semiconductor material is a SiGe alloy.

23. The method of claim 15, wherein the gate structure includes a silicon oxide layer disposed on a channel portion of the nanowire, a dielectric layer disposed on the silicon oxide layer, and a metal layer disposed on the dielectric layer.

24. The method of claim 15, wherein the gate structure is formed in circumferential layers surrounding the gate portion of the nanowire.

25. The method of claim 15, wherein the protective spacer includes a nitride material.

26. The method of claim 15, wherein the epitaxially grown doped semiconductor material is an in-situ doped material.

27. The method of claim 15, wherein the epitaxially grown doped semiconductor material is uniformly doped.

28. A nanowire field effect transistor (FET) device, comprising:
   a channel region including a silicon portion having a first distal end extending from the channel region and a second distal end extending from the channel region, the silicon portion is partially surrounded by a gate structure disposed circumferentially around the silicon portion;
   a source region including a first doped epi-silicon nanowire extension contacting the first distal end of the silicon portion; and
   a drain region including a second doped epi-silicon nanowire extension contacting the second distal end of the silicon portion.

29. The device of claim 28, wherein the first and second epi-silicon nanowire extensions are uniformly doped with ions.

30. The device of claim 28, wherein a portion of the first distal end of the silicon portion is doped with ions diffused from the first epi-silicon nanowire extension and a portion of the second distal end of the silicon portion is doped with ions diffused from the second epi-silicon nanowire extension.

31. The device of claim 28, wherein the silicon portion is elliptically shaped.

32. The device of claim 28, wherein the silicon portion is cylindrically shaped.

33. A nanowire field effect transistor (FET) device, comprising:
   a channel region including a silicon portion having a first distal end and a second distal end, the silicon portion is surrounded by a gate structure disposed circumferentially around the silicon portion;
   a first cavity defined by the first distal end of the silicon portion and an inner diameter of the gate structure;
   a second cavity defined by the second distal end of the silicon portion and an inner diameter of the gate structure;
   a source region including a first doped epi-silicon nanowire extension epitaxially extending from the first distal end of the silicon portion in the first cavity; and
   a drain region including a second doped epi-silicon nanowire extension epitaxially extending from the second distal end of the silicon portion in the second cavity.

34. The device of claim 33, wherein the first epi-silicon nanowire extension fills the first cavity and second epi-silicon nanowire extension fills the second cavity.

35. The device of claim 33, wherein the first and second epi-silicon nanowires are uniformly doped.

* * * * *